(12) United States Patent
Shieh et al.

(10) Patent No.: US 6,390,356 B1
(45) Date of Patent: May 21, 2002

(54) METHOD OF FORMING CYLINDRICAL BUMPS ON A SUBSTRATE FOR INTEGRATED CIRCUITS

(75) Inventors: Wen Lo Shieh; Fu Yu Huang; Yung-Cheng Chuang; Chia-Chieh Hu; Hui-Pin Chen; Ning Huang; Feng Chang Tu; Chung Ming Chang; Hua Wen Chiang; Hsuan Jui Chang, all of Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 09/693,951

(22) Filed: Oct. 23, 2000

(30) Foreign Application Priority Data

Jun. 15, 2000 (TW) .......................................... 089111780

(51) Int. Cl.[7] ......................... B23K 35/12; B23K 31/00
(52) U.S. Cl. ................................. 228/254; 228/248.5
(58) Field of Search ................................ 228/254, 256, 228/248.1, 248.5

(56) References Cited

U.S. PATENT DOCUMENTS 3,697,828 A * 10/1972 Oakes .................... 317/235 R
5,759,737 A * 6/1998 Feilchenfeld et al. ........ 430/311
5,775,569 A * 7/1998 Berger et al. ................ 228/254
5,860,585 A * 1/1999 Rutledge et al. ............ 228/254
5,868,304 A * 2/1999 Brofman et al. ............ 228/254
5,872,051 A * 2/1999 Fallon et al. ................ 438/616
5,902,686 A * 5/1999 Mis ............................. 428/629
5,984,166 A * 11/1999 Holzmann ................... 228/254
6,158,650 A * 12/2000 Holzmann ................ 228/248.1

* cited by examiner

Primary Examiner—Tom Dunn
Assistant Examiner—Zidia Pittman
(74) Attorney, Agent, or Firm—A & J

(57) ABSTRACT

A method of forming cylindrical bumps on a substrate for integrated circuits includes the steps of: forming copper circuits on a board of a substrate by means of electroplating; covering said board with a screening material; forming openings in said screening material to align with copper circuits on said board, filling pure copper or high melting point metal into said openings by electroplating to form cylindrical projections; forming a layer of solder alloy on an upper end of each of said cylindrical projections to be even with an upper surface of said screening material, and removing said screening material to leave the cylindrical bumps, whereby the engagement operation between the die and the substrate can be facilitated and the manufacture of the die can be easier.

1 Claim, 3 Drawing Sheets

METHOD OF FORMING CYLINDRICAL BUMPS ON A SUBSTRATE FOR INTEGRATED CIRCUITS

BACKGROUND OF THE INVENTION

1. Field of the Invention

This invention is related to a method of forming cylindrical bumps on a substrate for integrated circuits, which comprises the step of covering the substrate with a screening material, forming openings in the screening material to align with the copper circuits of the substrate, filling the openings with pure copper or high melting point metal to form cylindrical bumps, and then forming a layer of solder alloy on the top of each of the cylindrical bumps.

2. Description of the Prior Art

In the conventional flip chip technological process for connecting a die 2' to a substrate 1' (see FIGS. 1a and 1b), it is necessary to form under-bump-metallurgy (UBM) layers 21' from the input/output (I/O) of the die 2' and bumps 22' of solder alloy on the under-bump-metallurgy layers 21', and then turn over the die 2' to engage the substrate 1' (copper circuits 12' have already been formed on the board 11' of the substrate 1'). Thereafter, a underfill 3' is filled between the substrate 1' and the die 2'.

However, the bumps 22' made of solder alloy will be melted in a process at 100~350 degrees centigrade so that the gravitational force will lower the position of the die 2' thus reducing the distance between the bumps 22' of the die 2' and the substrate 1 and therefore increasing the difficulty in filling the underfill 3'. Hence, this method always results in some cylindrical bumps being defective, the numbers of which cannot be reduced.

Therefore, it is an object of the present invention to provide a method of forming cylindrical bumps on a substrate for integrated circuits which can obviate and mitigate the above-mentioned drawbacks.

SUMMARY OF THE INVENTION

This invention is related to a method of forming cylindrical bumps on a substrate for integrated circuits, which comprises the step of covering the substrate with a screening material, forming openings in the screening material to align with the copper circuits of the substrate, filling the openings with pure copper or high melting point metal to form cylindrical bumps, and then forming a layer of solder alloy on the top of each of the cylindrical bumps.

It is the primary object of the present invention to provide a method of forming bumps on a substrate for integrated circuits which includes the steps of increasing the thickness of the copper circuits and then electroplating a layer of solder alloy on the copper circuits so that the solder alloy will be melted but the copper or high melting point metal will not be melted in operation at temperatures between 100~350 degrees cenfigrade, thereby enabling the distance between the die and the substrate to be accurately controlled and therefore facilitating the filling of underfill.

It is another object of the present invention to provide a method of forming cylindrical bumps on a substrate for integrated circuits wherein the bumps are formed on the substrate instead of the die so that even if there is something wrong with the process of forming bumps on the substrate, the die has no need to be discarded, thereby decreasing the manufacturing cost.

It is a further object of the present invention to provide a method of forming cylindrical bumps on a substrate for integrated circuits which only requires the die to be coated with a under-bump-metallurgy layer rather than a under-bump-metallurgy layer and formation of bumps on the under-bump metallurgy layer as required by the conventional method, thereby reducing the time and cost of manufacturing dies.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts. Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIGS. 2a, 2b, 2c, 2d, 2e and 2f illustrate a method of forming cylindrical projections on a substrate for integrated circuits.

DETAILED DESCRIPTION OF THE PREFERRED EMBODIMENT

Figure 1A:
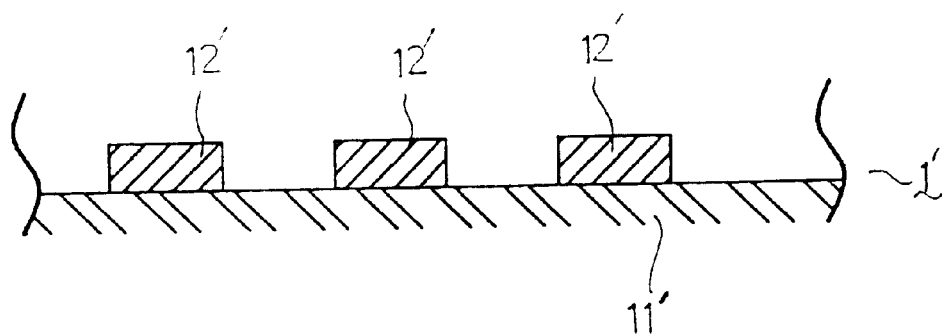
FIGS. 1a and 1b illustrate a conventional flip chip packaging process.
Figure 1B:
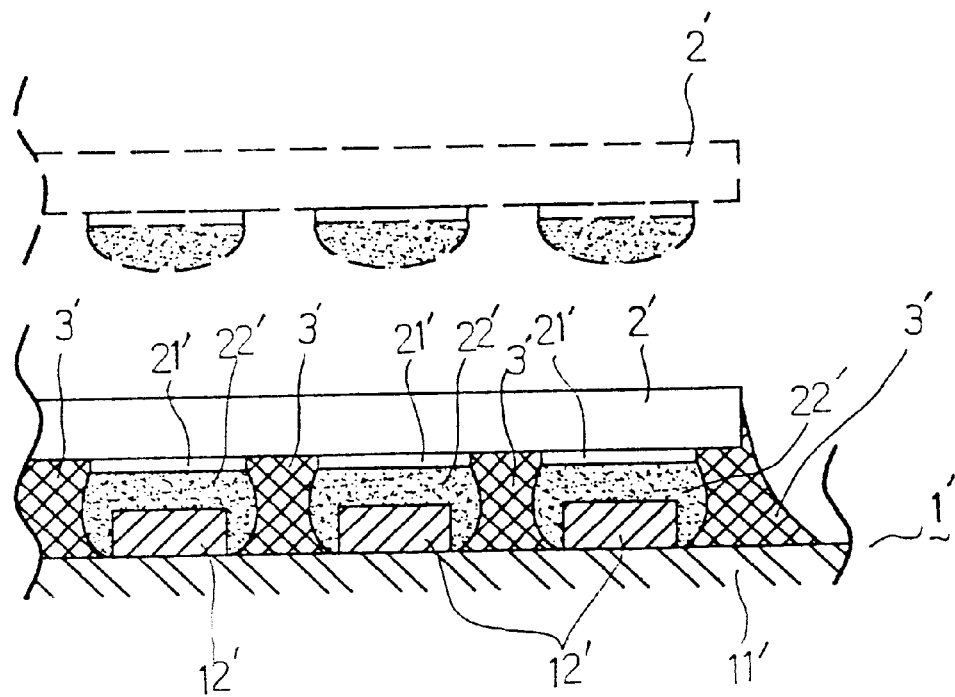

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

The present invention is related to a method of forming cylindrical projections on a substrate for integrated circuits which comprises the steps of covering the substrate with a screening material, forming openings in the screening material to align with the copper circuits of the substrate, filling the openings with pure copper or high melting point metal to form cylindrical bumps, and then forming a layer of solder alloy on the top of each of the cylindrical bumps.

Figure 2A:
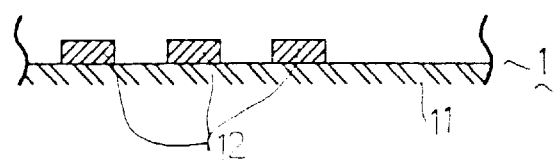
Figure 2B:
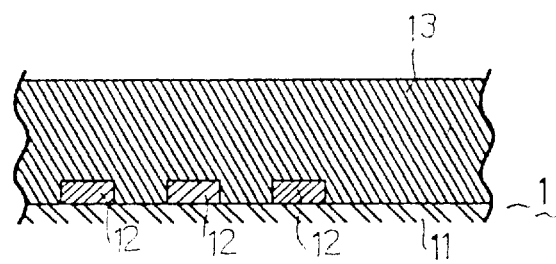
Figure 2C:
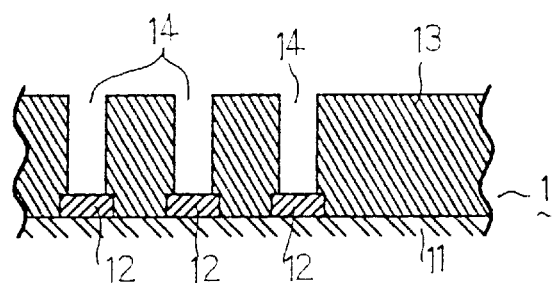
Figure 2B:
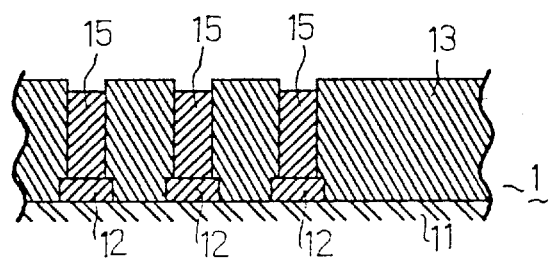
Figure 2E:
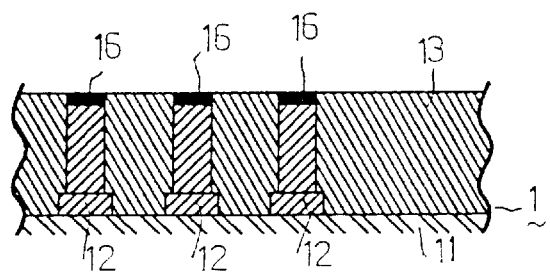
Figure 2F:
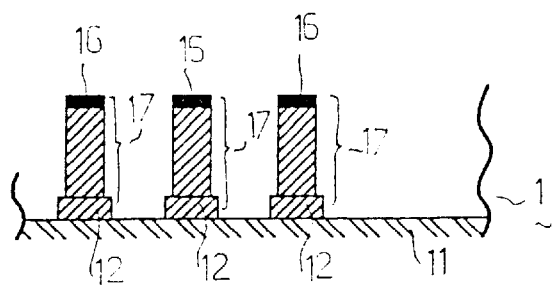
Figure 3:
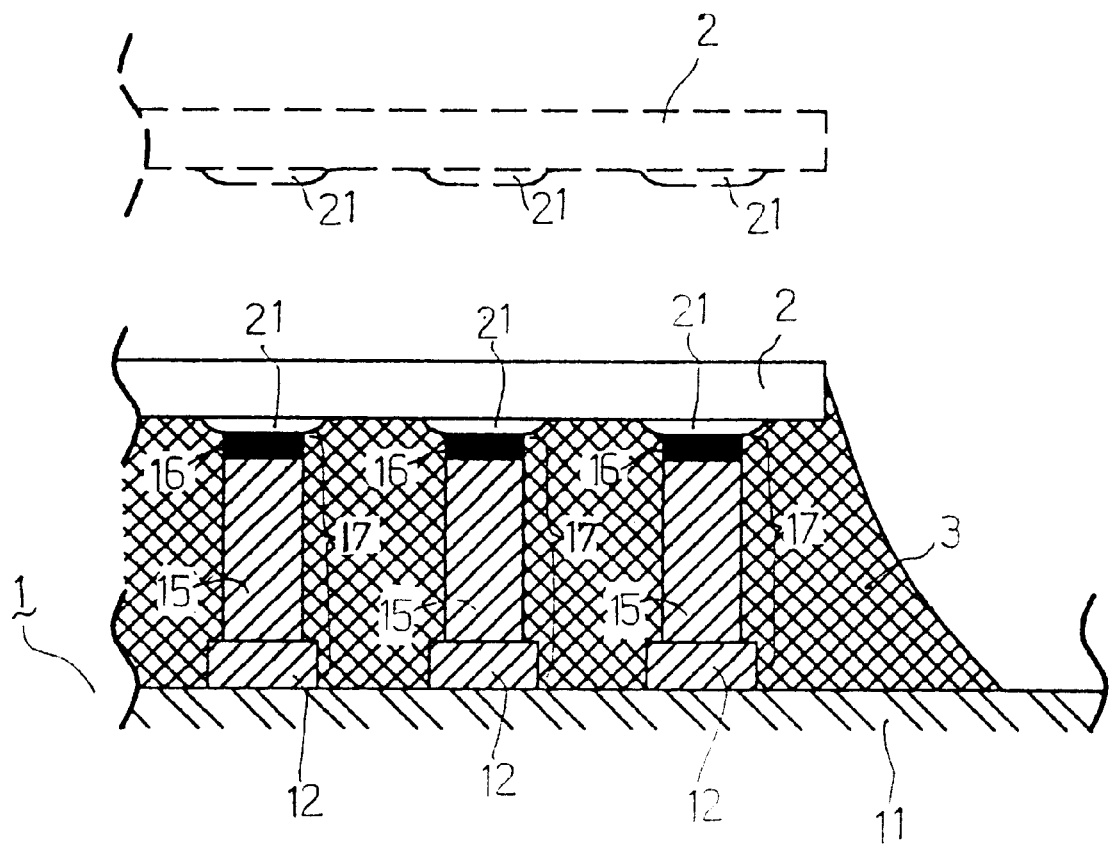
FIG. 3 illustrates how a die is engaged with the substrate according to the present invention by means of flip chip technique.

Referring to FIGS. 2a~2f, the method of forming cylindrical projections on a substrate according to the present invention comprises the steps of:

a. forming copper circuits 12 on a board 11 of a substrate 1 by means of conventional electroplating method (see FIG. 2a);

b. covering the board 11 with a screening material 13 on the board 11 (see FIG. 2b), the screening material 13 having a thickness equal to the height of the cylindrical projection 17 which will be mentioned after.

c. forming openings 14 in alignment with the copper circuits 12 on the screening material 13 (see. FIG. 2c);

d. filling pure copper or high melting point metal 15 into the openings 14 by conventional electroplating process to form cylindrical projections (see FIG. 2d);

e. forming a layer of solder alloy on the upper end of each cylindrical projection to be even with the upper surface of the screening material 13 (see FIG. 2e); and f. removing the screening material 13 to leave the cylindrical projections 17 (see FIG. 2f).

The cylindrical projections 17 are connected to a die 2 by flip chip technology As the cylindrical projections 17 are obtained by electroplating, the height of the cylindrical projections 17 can be accurately controlled thereby providing a suitable distance between the substrate 1 and the die 2 and therefore facilitating the filling of underfill. Furthermore, since the upper end of the cylindrical projection 17 has a layer of solder alloy 16, it is only necessary to form a under-bump-metallurgy layer 21 on the die 2 and it is no longer necessary to form solder alloy bumps on the die 2 thus preventing the die from being damaged by the process of forming bumps thereon.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A method of forming cylindrical bumps on a substrate for integrated circuits comprising the steps of:

forming copper circuits on a board of a substrate by means of electroplating;

covering said board with a screening material;

forming openings in said screening material to align with copper circuits on said board;

partially filling pure copper or high melting point metal into said openings by electroplating to form cylindrical projections;

forming a layer of solder alloy on an upper end of each of said cylindrical projections to be even with an upper surface of said screening material; and removing said screening material to leave the cylindrical bumps.

* * * * *